United States Patent [19]

Okayama

[11] Patent Number: 5,298,757
[45] Date of Patent: Mar. 29, 1994

[54] LENS FOR CHARGED PARTICLE BEAM

[75] Inventor: Shigeo Okayama, Tsukuba, Japan

[73] Assignees: Agency of Industrial Science and Technology; Ministry of International Trade and Industry, both of Tokyo, Japan

[21] Appl. No.: 16,264

[22] Filed: Feb. 11, 1993

[30] Foreign Application Priority Data

Feb. 18, 1992 [JP] Japan .................................. 4-069231

[51] Int. Cl.⁵ ............................................ H01J 37/153
[52] U.S. Cl. ........................ 250/396 R; 250/396 ML
[58] Field of Search ..................... 250/396 R, 396 ML

[56] References Cited

U.S. PATENT DOCUMENTS 4,075,488  2/1978  Okayama et al. ............... 250/396 R
4,429,229  1/1984  Gluckstern ................. 250/396 ML
4,743,756  5/1988  Krivanek .

FOREIGN PATENT DOCUMENTS 53-30628  8/1978  Japan .
55-28179  7/1980  Japan .
63-9340   2/1988  Japan .

Primary Examiner—Jack I. Berman
Attorney, Agent, or Firm—Oblon, Spivak, McClelland, Maier & Neustadt

[57] ABSTRACT

A lens for a charged particle beam comprises first, second, third and fourth quadrupoles, a first aperture electrode placed in front of the first quadrupole, a second aperture electrode placed between the first quadrupole and the second quadrupole, a third aperture electrode placed between the second quadrupole and the third quadrupole, a fourth aperture electrode placed between the third quadrupole and the fourth quadrupole, a fifth aperture electrode placed behind the fourth quadrupole, means for exciting the quadrupoles to cause them to converge the charged beam to a line near the third aperture electrode, and means for applying voltage to excite the first to fifth aperture electrodes and cause them to produce an octupole lens action for correcting aperture aberration.

4 Claims, 3 Drawing Sheets

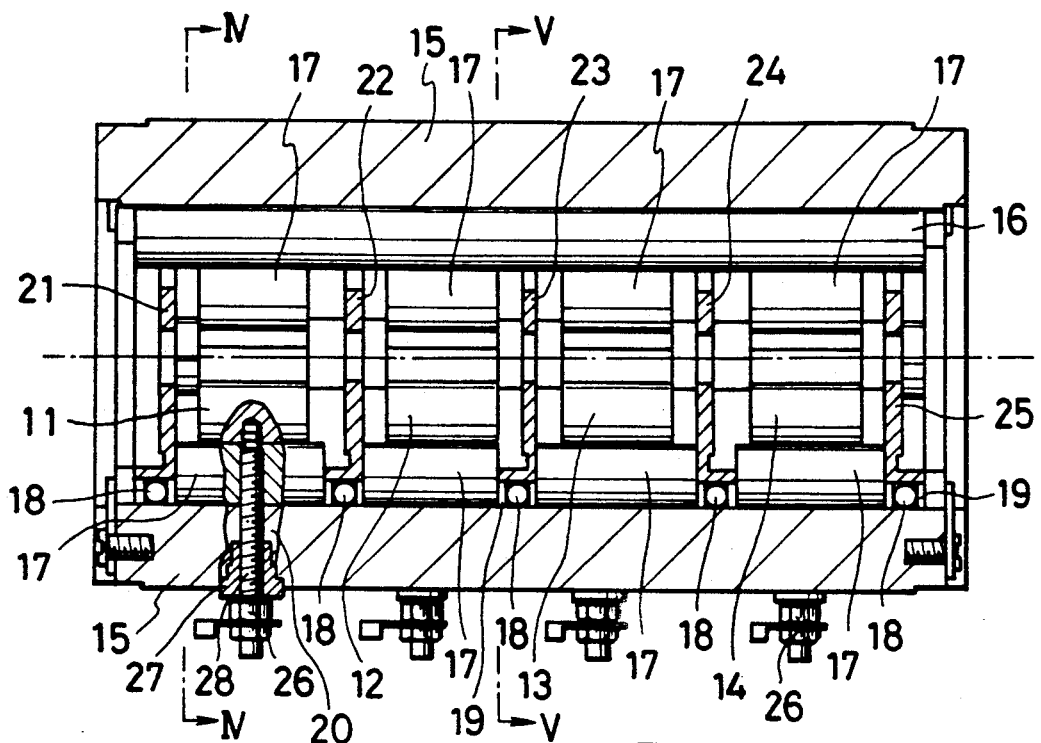
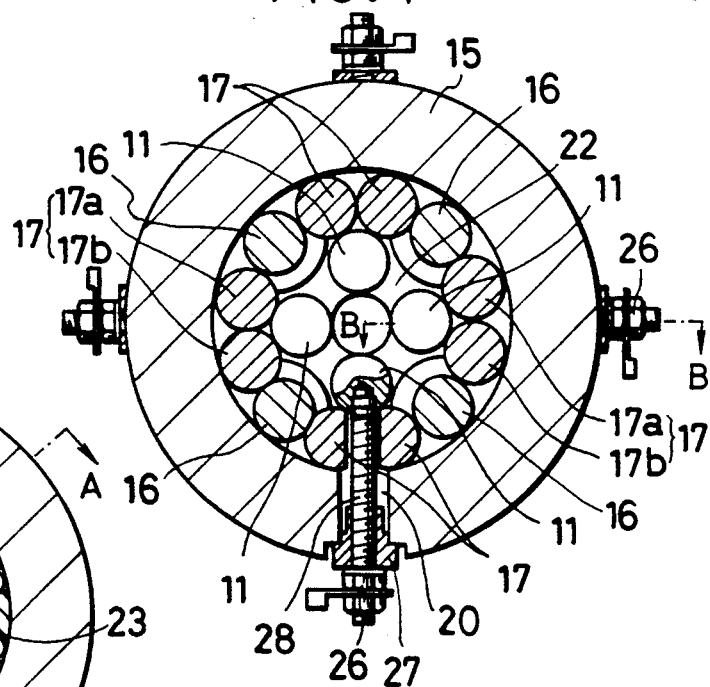
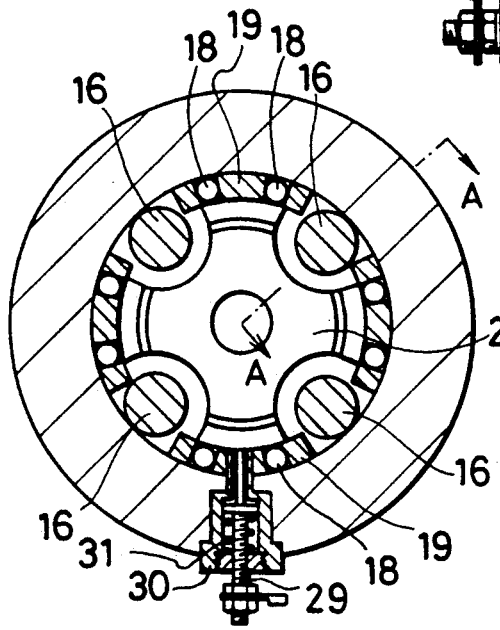

LENS FOR CHARGED PARTICLE BEAM

BACKGROUND OF THE INVENTION

1. Field of the Invention

This invention relates to a lens for a beam of charged particles that enables aperture (spherical) aberration control.

2. Prior Art Statement

Most charged particle beam lenses for use in electron and ion beam apparatuses have been of the type constituted as magnetic or electrostatic lenses whose configuration is rotationally (axially) symmetrical with the optical axis (Z axis), where the optical axis is defined as the center of the charged particle beam trajectory. Such axially symmetrical lenses do not allow correction for aperture aberration (spherical aberration).

On the other hand, in the quadrupole lens, which has four electrostatic or magnetic poles placed in parallel with the optical axis, a strong lens effect can be obtained owing to the fact that the main component of the electrostatic or magnetic field acts perpendicularly to the beam axis of charged particles. In its single stage configuration, however, the quadrupole lens is extremely asymmetrical, because it acts as a convergent (convex) lens in the XZ-plane and as a divergent (concave) lens in the YZ-plane.

Therefore, when the quadrupole lens is used for beam convergence in an ion microprobe mass analyzer, electron and ion beam lithography system, Auger electron spectroscopy system, x-ray microanalysis system or the like, it has to be combined with like lenses in two, three or more stages.

The characteristics and throughput of the aforementioned charged particle beam apparatuses improve in proportion as the beam current value rises when the beam is converged to a minute diameter. Insofar as there are no problems regarding the source size and radiation current, the beam current can be increased solely by enlarging the effective beam converging angle.

The size of the beam converging angle is, however, limited by the aperture (spherical) aberration of the lens. The blur $\Delta r$ caused by aperture aberration at the image position of a magnetic lens, cylinder lens, three-electrode lens or the like which is rotationally symmetrical to the beam axis can be expressed as $$\Delta r = C_S \beta^3 \tag{1}$$

where $\beta$ is the beam convergence angle and $C_S$ is the spherical aberration coefficient.

The aperture aberration of a quadrupole lens with non-rotationally symmetrical lens action is more complex than that of the aforesaid rotationally symmetrical lens. If the beam convergence angles in the XY-plane and the YZ-plane of the quadrupole lens system are defined as $\alpha$ and $\beta$, respectively, the aperture aberration coefficient, which is proportional to the third power of the beam convergence angles, $\alpha^p \beta^q$, can be expressed as $C_{Apq}$ and involves four terms. Specifically, in the XZ-plane the aperture aberration coefficient becomes $C_{A30}$ for p=3, q=0 and $C_{A12}$ for p=1, q=2, and in the YZ-plane becomes $C_{A21}$ for p=2, q=1 and $C_{A03}$ for p=0, q=3. The blurs $\Delta X$, $\Delta Y$ caused by the aperture aberrations can be expressed as $$\Delta X = (C_{A30} \cdot \alpha^2 + C_{A12} \cdot \beta^2)\alpha \tag{2}$$

$$\Delta Y = (C_{A21} \cdot \alpha^2 + C_{A03} \cdot \beta^2)\beta \tag{3}$$

In a lens system obtained by combining three or more quadrupole lens stages and used in the same manner as a rotationally symmetrical lens, if the XZ-plane lens magnification $|Mx|$ and the YZ-plane magnification $|My|$ are both equal to unity, then since it follows that $\alpha = \beta$, it also follows that the coefficients $C_{A21}$ and $C_{A12}$ are equal. This is called the stigmatic condition.

It is a principle of the lens design that the lens characteristics improve as the aperture aberration becomes smaller. It is therefore important to reduce the aperture aberration coefficient as far as possible. The reduction in the aperture aberration coefficient can be attained by the excitation control which is facilitated under the aforementioned stigmatic condition in the lens system.

It is generally possible to correct for aperture aberration in a quadrupole lens system by introducing an octupole lens into the system. Moreover, Japanese Patent Application Publications Sho 53-30628 and Sho 55-28179 teach that correction of aperture aberration can be achieved in a quadrupole lens system having no round lens effect, even without introducing an octupole lens. Specifically, these publications teach that the correction can be realized by introducing aperture electrodes to have the same optical axis as the quadrupole lens system and creating an octupole lens effect by exciting the aperture electrodes.

In the three-stage quadrupole lens systems disclosed in these prior art references, however, the coefficients $C_{A12}$ and $C_{A21}$ are not equal if the quadrupole lens excitation condition is not laterally symmetrical at the second quadrupole lens. Therefore, it becomes impossible to correct the four aperture aberration coefficients exactly the same.

In other words, since, for example, correcting coefficient $C_{A30}$ increases the coefficients $C_{A12}$ and $C_{A21}$ while correcting the coefficients $C_{A12}$ and $C_{A21}$ increases the coefficients $C_{A30}$ and $C_{A03}$, it becomes necessary to cancel out very large coefficients against each other. It is therefore necessary to induce a strong octupole lens effect for this purpose. Since a small amount of remaining misalignment therefore produces a large aberration and also owing to mechanical aberration caused by misalignment, the correction characteristics are markedly degraded.

By way of example, consider the correction system taught by Japanese Patent Application Publications Sho 63-9340 and illustrated FIGS. 6(a) and 6(b). The system consists of a combination of three quadrupole lens stages 1, 2 and 3 and two aperture electrodes 4 and 5. The potential distribution of the system is shown in FIG. 7, in which curve X is the beam trajectory in the XZ-plane, curve Y is the beam trajectory in the YZ-plane, and reference numbers 31, 32 and 33 designate the potential distributions of quadrupole, octupole and round lens components, respectively. In this correction system, since the aberration correction is performed under excitation conditions wherein the quadrupole lens system comprises three stages (for a detailed explanation of the potential distribution of these lenses, see U.S. Pat. No. 4,075,488) and $C_{A12} \neq C_{A21}$, there remains the problem that there cannot be realized a perfect correction system enabling free correction control of the aperture aberration coefficients.

In the same correction system, as is clear from the excitation strength (expressed as the ratio of applied voltage to accelerating voltage and indicated above the quadrupole lens system and the aperture electrodes in FIG. 7), the charged particle beam can be converged to a line near the beam entrance end of the second quadrupole only if the first-stage quadrupole is strongly excited. However, strong excitation of the first-stage quadrupole gives rise to problems such as that at the second quadrupole the separation of the beam from the axis in the XZ-plane (divergence-convergence-divergence) becomes large.

The present invention was accomplished in the light of the foregoing circumstances and has as its object to provide an axially symmetrical lens for a charged particle beam that enables control of correction and control of spherical aberration.

SUMMARY OF THE INVENTION

For achieving the aforesaid object, this invention provides a lens for a charged particle beam comprising first, second, third and fourth quadrupole lenses placed on a common optical axis, a first aperture electrode placed in front of the first quadrupole lens, a second aperture electrode placed between the first quadrupole lens and the second quadrupole lens, a third aperture electrode placed between the second quadrupole lens and the third quadrupole lens, a fourth aperture electrode placed between the third quadrupole lens and the fourth quadrupoleC lens, a fifth aperture electrode placed behind the fourth quadrupole lens, means for applying voltage to excite the quadrupoles to cause them to form a line beam near the third aperture electrode, and means for applying voltage to excite the first to fifth aperture electrodes to cause them to produce octupole lens effects for correcting aperture aberrations.

In the so-configured lens for charged particle beam, the first and fourth quadrupole lenses are applied with voltages which cause them to produce excitations of the same strength and the second and third quadrupole lenses are applied with voltages which cause them to produce excitations of the same strength, whereby the charged particle beam is converged to a line near the third aperture electrode, the magnification in the XZ-plane (convergence-divergence-divergence-convergence plane) becomes 1, and the magnification in the YZ-plane (divergence-convergence-convergence-divergence) becomes $-1$. In addition, the first aperture electrode and the fifth aperture electrode are applied with voltages causing them to produce excitations of the same strength and the second aperture electrode and the fourth aperture electrode are applied with voltages causing them to produce excitations of the same strength. Since the excitation condition is therefore symmetrical with respect to the third aperture electrode as the center, the aberration coefficient $C_{A12}$ and the aberration coefficient $C_{A21}$ are equal, whereby it becomes possible to suppress enlargement of the aberration coefficients $C_{A12}$ and $C_{A21}$ by exciting the third aperture electrode to correct the XZ-plane aperture aberration coefficient $C_{A30}$ in the vicinity of the position where the beam trajectory in the YZ-plane intersects the optical axis. In addition, the voltage applied to the first and fifth aperture electrodes and the voltage applied to the second and fourth aperture electrodes are adjusted to produce octupole lens actions for correcting to near zero the aperture aberration coefficient $C_{A03}$ owing to the aperture angle $\beta^3$, the aperture aberration coefficient $C_{A12}$ owing to the aperture angle $\alpha\beta^2$ and the aperture aberration coefficient $C_{A21}$ owing to the aperture angle $\alpha^2\beta$.

Thus in the present invention, the third aperture electrode is placed at the center between symmetrically placed front and rear stages each consisting of two quadrupole lenses and two aperture electrodes and the corresponding lenses and electrodes of the front and rear stages are applied with the same voltage. As a result, the potential distribution is symmetrical, the charged beam is converged to a line near the third aperture electrode, and the aperture aberration coefficients $C_{A12}$ and $C_{A21}$ are equal. In other words, the stigmatic condition is established so that by exciting the third aperture electrode the aperture aberration coefficient $C_{A30}$ can be corrected without marked enlargement of the aperture aberration coefficients $C_{A12}$ and $C_{A21}$. A balance is thus achieved between, on the one hand, the correction of the aberration coefficient $C_{A03}$ resulting from the excitation of the first and fifth aperture electrodes and the enlargement of the aberration coefficients $C_{A12}$ and $C_{A21}$ which accompanies this correction and, on the other hand, the correction of the aberration coefficient $C_{A12}$ ($=C_{A21}$) resulting from the excitation of the second and fourth aperture electrode and the enlargement of the aberration coefficients $C_{A03}$ and $C_{A30}$ which accompanies this correction, and therefore, the values of the four aperture aberration coefficients can be controlled as desired. In other words, the four aperture aberration coefficients can be simultaneously be made zero.

The above and other features of the present invention will become apparent from the following description made with reference to the drawings.

BRIEF DESCRIPTION OF THE DRAWINGS

FIG. 3 is a sectional view of an embodiment of the lens for charged beam according to the invention.

FIG. 4 is a sectional view taken along line IV—IV in FIG. 3.

FIG. 5 is a sectional view taken along line V—V in FIG. 3.

DESCRIPTION OF THE PREFERRED EMBODIMENT

Figure 1A:
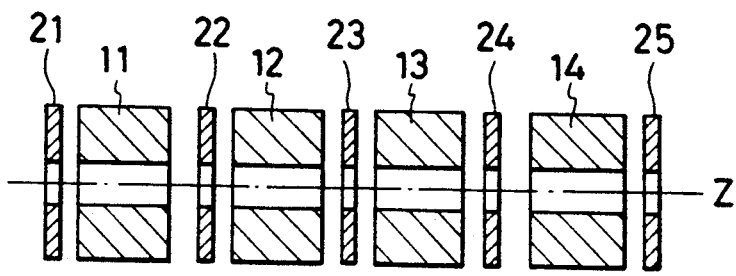
FIG. 1(a) is a schematic sectional view of the basic configuration of the lens for charged beam according to the invention.
Figure 1B:
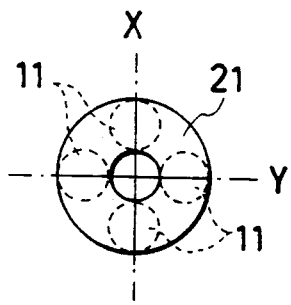
FIG. 1(b) is a side view showing the lens in FIG. 1(a).

In the basic configuration of the lens for charged beam according to the invention shown in FIG. 1, reference numerals 11, 12, 13 and 14 designate first, second, third and fourth electrostatic quadrupoles, and reference numerals 21, 22, 23, 24 and 25 designated first, second, third, fourth and fifth aperture electrodes. These elements are placed on an optical axis 6, with the first aperture electrode 21 positioned in front of the first quadrupole 11, the second aperture electrode 22 positioned between the first quadrupole 11 and the second quadrupole 12, the third aperture electrode 23 positioned between the second quadrupole 12 and the third qudrupole 13, the fourth aperture electrode 24 positioned between the third quadrupole 13 and the fourth quadrupole 14, and the fifth aperture electrode 25 positioned behind the fourth quadrupole 14. While the spacing between these quadrupole and electrodes is appropriately determined according to the design conditions, the spacing of the set of quadrupoles and electrodes in front of the third aperture electrode 23 and the spacing of the set of quadrupoles and electrodes behind the third aperture electrode 23 should preferably be such that the two sets are symmetrical with respect to the third aperture electrode 23 at the center. The effect of the invention can be obtained, however, even if the two quadrupole and electrode sets are not symmetrically positioned on opposites sides of the third aperture electrode 23. In this latter case, excitation control has to be conducted separately for the two sets. As a voltage source usable as the means for applying voltage to the quadrupoles 11-14 and the aperture electrodes 21-25, there can be mentioned the John Fluke Mfg. Co., Inc. (U.S.A.) models 415B and 343A and the Systron Donner Co. (U.S.A.) model M107. (The voltage applying means are omitted from the drawings.)

While the illustrated embodiment is shown to use electrostatic quadrupoles, it is possible to use magnetic quadrupoles instead. As the aperture electrodes there can be used the type disclosed in U.S. Pat. No. 4,075,488.

In the charged particle beam lens of the aforesaid configuration, the first quadrupole 11 and the fourth quadrupole 14 are applied with voltages which cause them to produce excitations of the same strength. Likewise, the second quadrupole 12 and the third quadrupole 13 are applied with voltages which cause them to produce excitations of the same strength.

Figure 2:
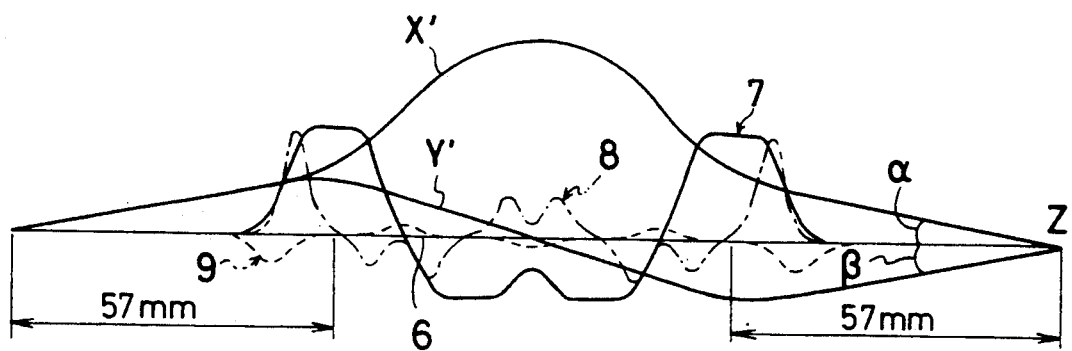
FIG. 2 is a graph showing the beam trajectories, excitations and potential distributions of the lens of FIG. 1(a).
Figure 6A:
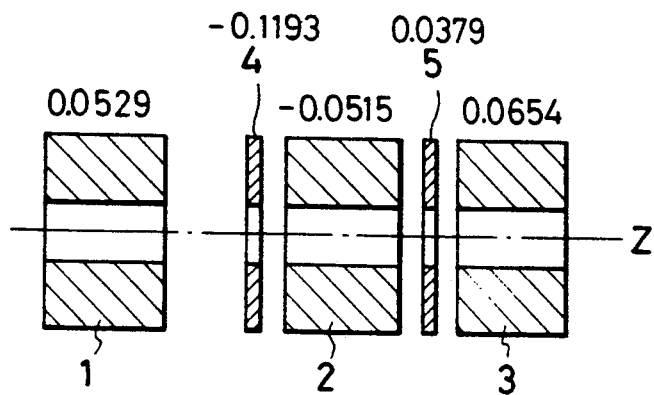
FIG. 6(a) is a schematic sectional view of the configuration of a prior art lens for charged beam.
Figure 6B:
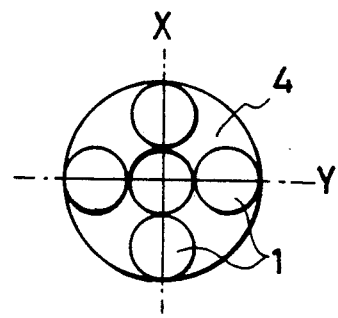
FIG. 6(b) is a side view showing the lens in FIG. 6(a).
Figure 7:
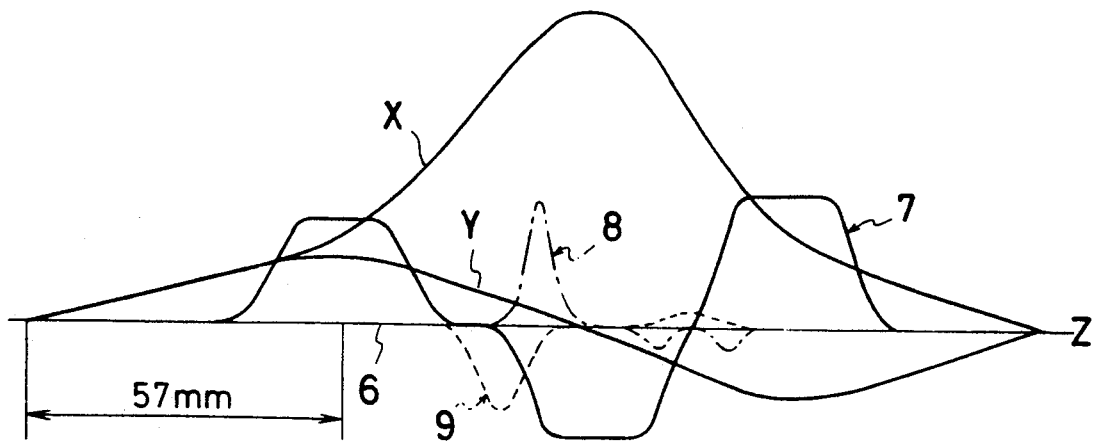
FIG. 7 is a graph showing the beam trajectories, excitations and potential distributions of the prior art lens.

As shown by curve 7 in FIG. 2, this causes the potential distribution of the quadrupole lenses to be symmetrical with respect to the position of the third aperture electrode 23 at the center, the charged beam to be converged to a line near the third aperture electrode 23, the XZ-plane magnification to be 1 and the YZ-plane magnification to be 1.

Further, the first aperture electrode 21 and the fifth aperture electrode 25 are applied with voltages which cause them to produce excitations of the same strength, while the second aperture electrode 22 and the fourth aperture electrode 24 are also applied with voltages which cause them to produce excitations of the same strength.

As shown in FIG. 2, this causes the distribution of the excitations produced by the four aperture electrodes to be symmetrical with respect to the third aperture electrode 23 at the center, and the aperture aberration coefficient $C_{A12}$ in the XZ-plane and the aperture aberration coefficient $C_{A21}$ in the YZ-plane to be equal. Moreover, the aperture aberration coefficients $C_{A03}$ and $C_{A12}$ are corrected by controlling the excitations of the first aperture electrode 21 and the fifth aperture electrode 25 and the excitations of the second aperture electrode 22 and the fourth aperture electrode 24, while the aperture aberration coefficient $C_{A30}$ is independently corrected in the vicinity of the point where the beam trajectory Y' intersects the optical axis 6 by exciting the third aperture electrode 23.

As explained in the foregoing, the lens for charged particle beam according to the invention comprises four quadrupoles and five aperture electrode. The lens excitation distribution is made symmetrical with respect to the third aperture electrode at the center by applying identical voltages to the first quadrupole and the fourth quadrupole and to the second quadrupole and the third quadrupole. Thus, the charged beam is converged to a line near the third aperture electrode and the aperture aberration coefficients $C_{A12}$ and $C_{A21}$ are made to satisfy the stigmatic condition. The correction of the aperture aberration $C_{A30}$ is achieved by the excitation of the third aperture electrode, while the correction of the remaining aperture aberration coefficients $C_{A03}$ and $C_{A12}$ is achieved via the voltages applied to the first and fifth aperture electrodes and to the second and fourth aperture electrodes. The corrections can therefore be achieved with utmost ease. (Aperture aberration coefficient $C_{A21}$ is corrected simultaneously with $C_{A12}$.)

FIGS. 3-5 show one example of the configuration of an embodiment of the lens for charged beam according to the invention. The upper half of FIG. 3 is a section taken along line A—A in FIG. 5 and the lower half thereof is a section taken along line B—B in FIG. 4. Reference numerals 11, 12, 13 and 14 designate the first to fourth quadrupoles, and 21, 22, 23, 24 and 25 designate the first to fifth aperture electrodes.

Reference numeral 15 designates a casing cylinder. Four cylindrical shafts 16 of approximately the same length as the casing cylinder 15 are placed in contact with the inner surface of the casing cylinder 15 at positions spaced by 90° from each other.

The first aperture electrodes 21-25 are notched at the positions where the cylindrical shafts 16 Pass so as not to make contact with the cylindrical shafts 16. Moreover, adjacent ones of the first aperture electrodes 21-25 are maintained at a fixed distance from each other in the casing cylinder 15 by first spacers 17. Each of the first spacers 17 consists of a pair of insulator rods 17a, 17b of such diameter that when fit between adjacent cylindrical shafts 16 to be in contact with the inner surface of the casing cylinder 15 they also make contact with the adjacent cylindrical shafts 16.

Each aperture electrode has raised portions on its outer edge and a second spacer 18 consisting of accurate balls retained by a housing 31 is fitted in the gap between each raised portion and the inner surface of the casing cylinder 15. The accurate balls 18 serve to ensure high concentricity of the aperture electrodes and to maintain them in an insulated state.

At the position of each first spacer 17 where each quadrupole is fixed, a through-hole 19 is opened from the outer surface of the casing cylinder 15 to as far as the first spacer 17. A bolt 20 for electrode fixation is inserted into the through-hole 19 and a quadrupole electrode is fixed on the tip thereof. By tightening a nut 26 on the portion of the bolt 20 outside the casing cylinder 15, the quadrupole electrode can be precisely position in the recess between the pair of insulator rods 17a, 17b. If the casing cylinder 15 is made of metal, a collar 27 is fitted over the bolt 20 for preventing the bolt 20 from directly contacting the casing cylinder 15. The bolts 20 are not shown in FIG. 5. The bolts 20 are also used as terminals for applying voltage to the quadrupole electrodes. Reference numeral 28 designates one of five terminals for applying voltage to the aperture electrodes. It is secured to the casing cylinder 15 through a collar 29 and its tip is urged into contact with the aperture electrode by a spring 30.

As is clear from the foregoing, the quadrupole electrodes and the aperture electrodes are positioned and fixed with respect to a precision-machined casing cylinder by the use of cylindrical spacers and ball spacers, both of which are easy to machine to high precision. Therefore, where, for example, a charged beam lens comprising four quadrupoles and five aperture electrodes is fabricated, both the quadrupole electrodes and the aperture electrodes can be easily aligned with high precision in the axial direction and with high concentricity.

The table below shows an example of the aperture aberration control characteristics of a charged beam lens according to the invention comprising four quadrupoles and five aperture electrodes, as obtained by calculating how the aperture aberration coefficient varies with the strength of the excitation. The column in this table captioned "Before aperture electrode excitation" shows the characteristics of the four-stage quadrupole lens system without application of voltage to the aperture electrodes.

|  | Before aperture electrode excitation | After aperture electrode excitation |
|---|---|---|
| Quadrupole excitation | | |
| $V_{Q1}/V_a$ | ±0.038699 | ±0.038627 |
| $V_{Q2}/V_a$ | ∓0.020972 | ∓0.020946 |
| $V_{Q3}/V_a$ | ∓0.020972 | ∓0.020946 |
| $V_{Q4}/V_a$ | ±0.038699 | ±0.038627 |
| Aperture electrode excitation | | |
| $V_{A1}/V_a$ | 0 | −0.038961 |
| $V_{A2}/V_a$ | 0 | +0.013455 |
| $V_{A3}/V_a$ | 0 | −0.013568 |
| $V_{A4}/V_a$ | 0 | +0.013455 |
| $V_{A5}/V_a$ | 0 | −0.038961 |
| Magnification | | |
| $M_x$ | 1 | 1 |
| $M_y$ | −1 | −1 |
| Aperture aberration coefficient (mm) | | |
| $C_{A30}$ | 87780 | 0 |
| $C_{A12}$ | 1408 | 0 |
| $C_{A21}$ | 1408 | 0 |
| $C_{A03}$ | 2053 | 0 |

The quadrupole lenses were of the electrostatic type and were constituted using cylindrical electrodes of 8 mm in diameter and 14 mm in length. Annular aperture electrodes measuring 33 mm in diameter, 2 mm in thickness and 7 mm in hole diameter were used. The spacing between the first aperture electrode and the first quadrupole and that between the fifth aperture electrode and the fourth quadrupole was 3 mm, the spacing between the first quadrupole and the second aperture electrode and between the fourth quadrupole and the fourth aperture electrode was 5 mm, the spacing between the second aperture electrode and the second quadrupole and between the fourth aperture electrode and the third quadrupole was 3 mm, and the spacing between the second quadrupole and the third aperture electrode and between the third quadrupole and the third aperture electrode was 3 mm. The distance from the beam source or its cross over to the center of the first quadrupole and the distance from the center of the fourth quadrupole to the convergence point were calculated as 57 mm.

In the table, the excitation is expressed as the ratio of applied voltage to accelerating voltage. For example, if the accelerating voltage $V_a$ is 20 kV when the excitation $V_{Q1}/V_a$ is ±0.038699, this means that the voltage applied to the first quadrupole is ±773.98 V.

Therefore, the reason that at $V_{Q1}$ and $V_{Q2}$ the quadrupole excitation becomes weaker by around 0.19% and 0.12% between before and during aperture electrode excitation is that the electrostatic round lens action induced by the aperture electrode excitation has a weak rotationally symmetrical convergence effect on the charged beam and this effect causes a shift in the focal point. This displacement is corrected by the excitation of the quadrupoles.

In FIG. 2, the (solid) curve 7 is the potential distribution representing the quadrupole lens field, the (single dot chain) curve 8 is the potential distribution representing the octupole lens field, and the (broken) curve 9 is the potential distribution representing the electrostatic round lens field.

The correction lens constituted by the quadrupoles and the aperture electrodes is characterized by these potential distributions: the axially symmetrical electrostatic lens action of the aperture electrode excitation is extremely weak; the focusing characteristics of the lens are substantially determined by the quadrupole lens actions; and the aperture aberration can be controlled by aperture electrode excitation.

As the table shows, before the aperture electrodes were excited, the values of the aperture aberration coefficients were 87780 mm for $C_{A30}$, 1408 mm for $C_{A12}$ and $C_{A21}$, and 2053 mm for $C_{A03}$. When the quadrupoles and the aperture electrodes were excited by application of a voltage not higher than 3.9% of the accelerating voltage, however, all aperture aberration coefficients could be reduced to about zero by this relatively weak excitation.

Moreover, the invention enables the aperture aberration to be freely controlled, which has not been possible with prior art lenses of this type. Owing to this capability, the lens according to the invention can be used for canceling the aperture aberration coefficient $C_S$ of an axially symmetrical magnetic lens or electrostatic round lens simply by placing it in front of or behind the axially symmetrical lens.

More specifically, by controlling the excitation conditions of the quadrupoles and the aperture electrodes constituting the lens according to the invention it is possible to realize a correction system wherein $C_{A30} = C_{A12} = C_{A21} = C_{A03} = -C_S$.

To summarize, the present invention divides the voltages supplied to five aperture electrodes into three groups, corrects one of the four aperture aberration coefficients by the excitation produced by the voltage supplied to the third aperture electrode, and corrects the remaining three aperture aberration coefficients by balancing the excitations produced by the voltages supplied to the first aperture electrode and the fifth aperture electrode and the excitations produced by the voltages supplied to the second aperture electrode and the fourth aperture electrode. It thus enables the corrections to be achieved simply and, in particular, can be applied to a lens with a magnification of 1 to realize a lens system completely free of aberration. When applied to various types of conventional industrial and scientific equipment employing electron or ion beams, it greatly relaxes the restrictions that have heretofore limited the charged beam utilization efficiency and beam size in such equipment, in this way producing a marked economic effect through the enhancement of performance and throughput.

What is claimed is:

1. A lens for charged particle beam comprising a first quadrupole, a second quadrupole placed behind and on the same optical axis as the first quadrupole, a third quadrupole placed behind and on the same optical axis as the second quadrupole, a fourth quadrupole placed behind and on the same optical axis as the third quadrupole, a first aperture electrode placed in front of the first quadrupole, a second aperture electrode placed between the first quadrupole and the second quadrupole, a third aperture electrode placed between the second quadrupole and the third quadrupole, a fourth aperture electrode placed between the third quadrupole and the fourth quadrupole, a fifth aperture electrode placed behind the fourth quadrupole, first voltage applying means for applying voltages to the first quadrupole and the fourth quadrupole to cause them to produce excitations of the same strength, second voltage applying means for applying voltages to the second quadrupole and the third quadrupole to cause them to produce excitations of the same strength, third voltage applying means for applying voltages to the first aperture electrode and the fifth aperture electrode to cause them to produce excitations of the same strength, fourth voltage applying means for applying voltages to the second aperture electrode and the fourth aperture electrode to cause them to produce excitations of the same strength, and fifth voltage applying means for applying a voltage to the third aperture electrode to cause it to produce an excitation of a prescribed independent strength, the excitations of the four quadrupoles causing the charged beam to converge to a line near the third aperture electrode and the excitations of the five aperture electrodes correcting aperture aberrations.

2. A lens for charged particle beam according to claim 1, wherein the first and second quadrupoles and the first and second aperture electrodes in front of the third aperture electrode and the third and fourth quadrupoles and the fourth and fifth aperture electrodes behind the third aperture electrode are spaced to be symmetrical with respect to the third aperture electrode at the center.

3. A lens for charged particle beam according to claim 1, wherein the quadrupoles are electrostatic quadrupoles.

4. A lens for charged particle beam according to claim 1, wherein the quadrupoles are magnetic quadrupoles.

* * * * *